(12) United States Patent
Kuroda et al.

(10) Patent No.: US 6,467,070 B2
(45) Date of Patent: Oct. 15, 2002

(54) DESIGN SUPPORT APPARATUS FOR SEMICONDUCTOR DEVICES

(75) Inventors: Sachi Kuroda, Kawasaki (JP); Toshiaki Sugioka, Kawasaki (JP); Toru Osajima, Kawasaki (JP); Shigenori Ichinose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 09/808,344

(22) Filed: Mar. 15, 2001

(65) Prior Publication Data

US 2001/0039643 A1 Nov. 8, 2001

(30) Foreign Application Priority Data

Jun. 5, 2000  (JP) ........................................ 2000-168009

(51) Int. Cl.$^7$ ............................................... G06F 17/50
(52) U.S. Cl. ................. 716/8; 716/11; 716/17
(58) Field of Search ................. 716/1, 4, 5, 8, 716/9, 10, 11, 12, 13, 14, 15, 16, 17, 18; B06F 17/50

(56) References Cited

U.S. PATENT DOCUMENTS

| | | | |
|---|---|---|---|
| 5,666,288 A | * | 9/1997 | Jones et al. .................... 716/17 |
| 5,787,013 A | * | 7/1998 | Yui ............................. 716/14 |
| 5,818,727 A | * | 10/1998 | Sekiguchi ..................... 716/14 |
| 5,987,086 A | * | 11/1999 | Raman et al. .................. 716/1 |
| 6,170,080 B1 | * | 1/2001 | Ginetti et al. ................. 716/18 |
| 6,292,929 B2 | * | 9/2001 | Scepanovic et al. ........... 716/14 |
| 6,397,169 B1 | * | 5/2002 | Shenoy et al. ................. 703/14 |
| 6,405,354 B1 | * | 6/2002 | Itazu et al. .................... 716/11 |
| 2001/0049813 A1 | * | 12/2001 | Chan et al. .................... 716/8 |
| 2002/0004929 A1 | * | 1/2002 | Osaki et al. ................... 716/10 |

FOREIGN PATENT DOCUMENTS

| | | | |
|---|---|---|---|
| JP | 07086415 A | 3/1995 | ........... H01L/21/82 |
| JP | 2000035976 A | 2/2000 | ........... G06F/17/50 |
| JP | 2000048063 A | 2/2000 | ........... G06F/17/50 |

* cited by examiner

*Primary Examiner*—Don Wong
*Assistant Examiner*—Trinh Vo Dinh
(74) *Attorney, Agent, or Firm*—Staas & Halsey LLP

(57) ABSTRACT

A design support apparatus for semiconductor devices that is used to quickly arrange a non-logic cell for reducing electromagnetic radiation from a semiconductor device at the time of designing it. In this design support apparatus for semiconductor devices, a layout section does a layout for logic cells and wiring patterns to connect the logic cells. An arranged site detecting section detects an arranged site, being a site which contains neither the logic cells nor a prohibited area, after a layout is done by the layout section. A non-logic cell pattern store section stores non-logic cell patterns. A prohibited area containing site detecting section detects a prohibited area containing site, being a site which only contains a prohibited area. A non-logic cell arranging section arranges non-logic cells on the arranged site. Furthermore, the non-logic cell arranging section compares the arrangement of the prohibited area on the prohibited area containing site with a non-logic cell pattern and arranges non-logic cells only on a site where these do not conflict with each other.

13 Claims, 16 Drawing Sheets

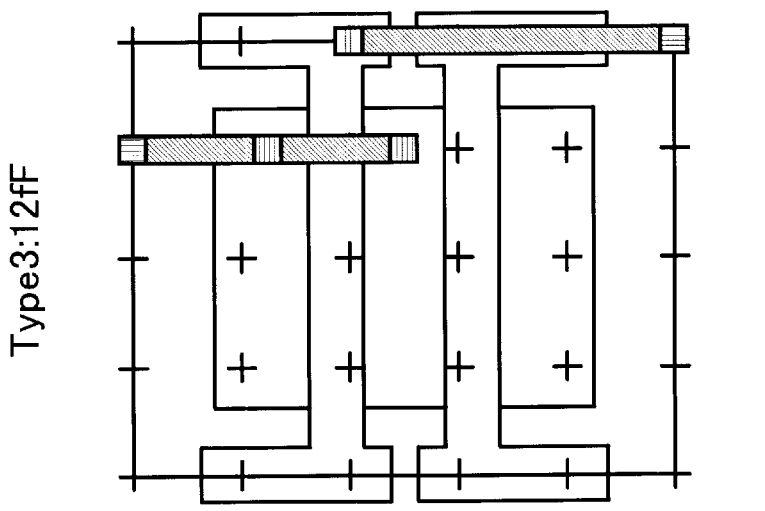
FIG. 3(A) Type1:10fF
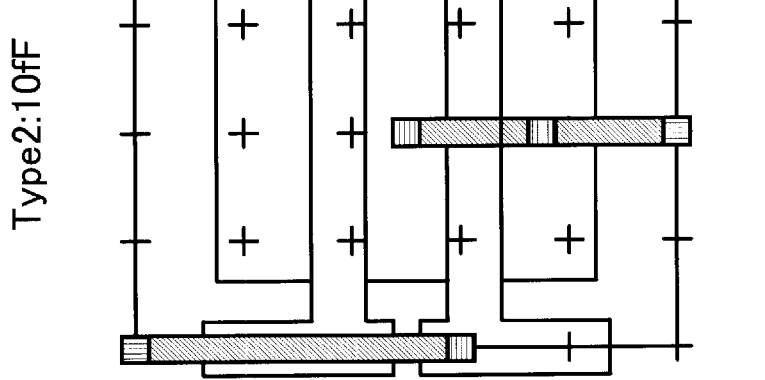
FIG. 3(B) Type2:10fF
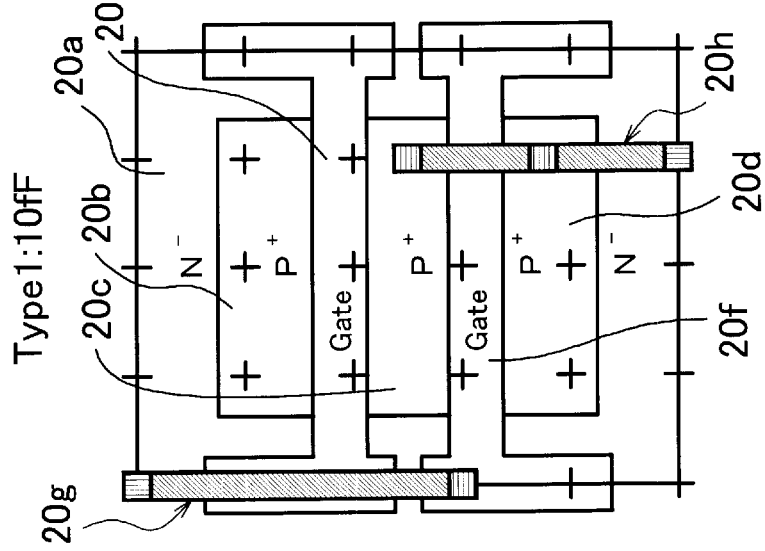
FIG. 3(C) Type3:12fF

REPORT SCREEN

|         | NUMBER | CAPACITY VALUE (pF) |
|---------|--------|---------------------|
| Type1:  | 23000  | 230                 |
| Type2:  | 40000  | 400                 |
| Type3:  | 12000  | 144                 |
| Total:  | 75000  | 774                 |

DESIGN SUPPORT APPARATUS FOR SEMICONDUCTOR DEVICES

BACKGROUND OF THE INVENTION (1) Field of the Invention

This invention relates to a design support apparatus for semiconductor devices and, more particularly, to a design support apparatus for semiconductor devices that can arrange non-logic cells easily.

(2) Description of the Related Art

With an increase in clock signal frequencies, the occurrence of electromagnetic radiation in a semiconductor device, such as a large-scale integrated circuit (LSI), is becoming an important problem in recent years.

Conventionally, various methods have been adopted in order to prevent the occurrence of such electromagnetic radiation. The method of reducing the impedance of power supply at a high frequency by adding a decoupling capacitor to a power supply line in an LSI is known as an effective one.

By the way, a decoupling capacitor is an equivalent one consisting of, for example, metal oxide semiconductor field effect transistors (MOS-FET) and can be formed by the same process as with a logic element.

In most conventional methods, therefore, these equivalent capacitors have been treated the same as other logic elements and an automatic layout has been done for them.

Furthermore, not only decoupling capacitors but also many other things, which are not logic elements, are arranged on an integrated circuit chip. Conventionally, arranging and wiring processes on non-logic cells containing these patterns which do not form a logic circuit and on logic cells containing patterns which form a logic circuit have been performed at the same time.

With this method, however, layouts must be done with equivalent capacitors etc. contained. This increases the number of elements for which a layout is done by that of equivalent capacitors etc., so it will take much time to perform a layout process.

In addition, after a layout, performance tests are performed on a semiconductor device by a delay simulation etc. If the tests show that the semiconductor device is not equipped with desired performance, a layout process must be performed again. In this case, the second layout process must be performed on all elements including equivalent capacitors, so it will take much time to perform it.

SUMMARY OF THE INVENTION

In order to address such problems, the present invention was made. In other words, an object of the present invention is to provide a design support apparatus for semiconductor devices that enables to avoid complex and time-consuming design work resulting from the existence of non-logic cells.

In order to achieve the above object, a design support apparatus for semiconductor devices for helping to design semiconductor devices is provided. This design support apparatus for semiconductor devices comprises layout means for doing a layout for logic cells and wiring patterns to connect the logic cells, arranged site detecting means for detecting, after a layout being done by the layout means, an arranged site being a site containing neither the logic cells nor a prohibited area, and non-logic cell arranging means for arranging non-logic cells on the arranged site.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 3(A), 3(B), and 3(C) are views showing examples of non-logic cells to be arranged in the present invention, FIG. 3(A) being a view showing a Type 1 non-logic cell, FIG. 3(B) being a view showing a Type 2 non-logic cell, and FIG. 3(C) being a view showing a Type 3 non-logic cell.

FIG. 13 is an example of a report screen.

DESCRIPTION OF THE PREFERRED EMBODIMENTS

Embodiments of the present invention will now be described with reference to the drawings.

Figure 1:
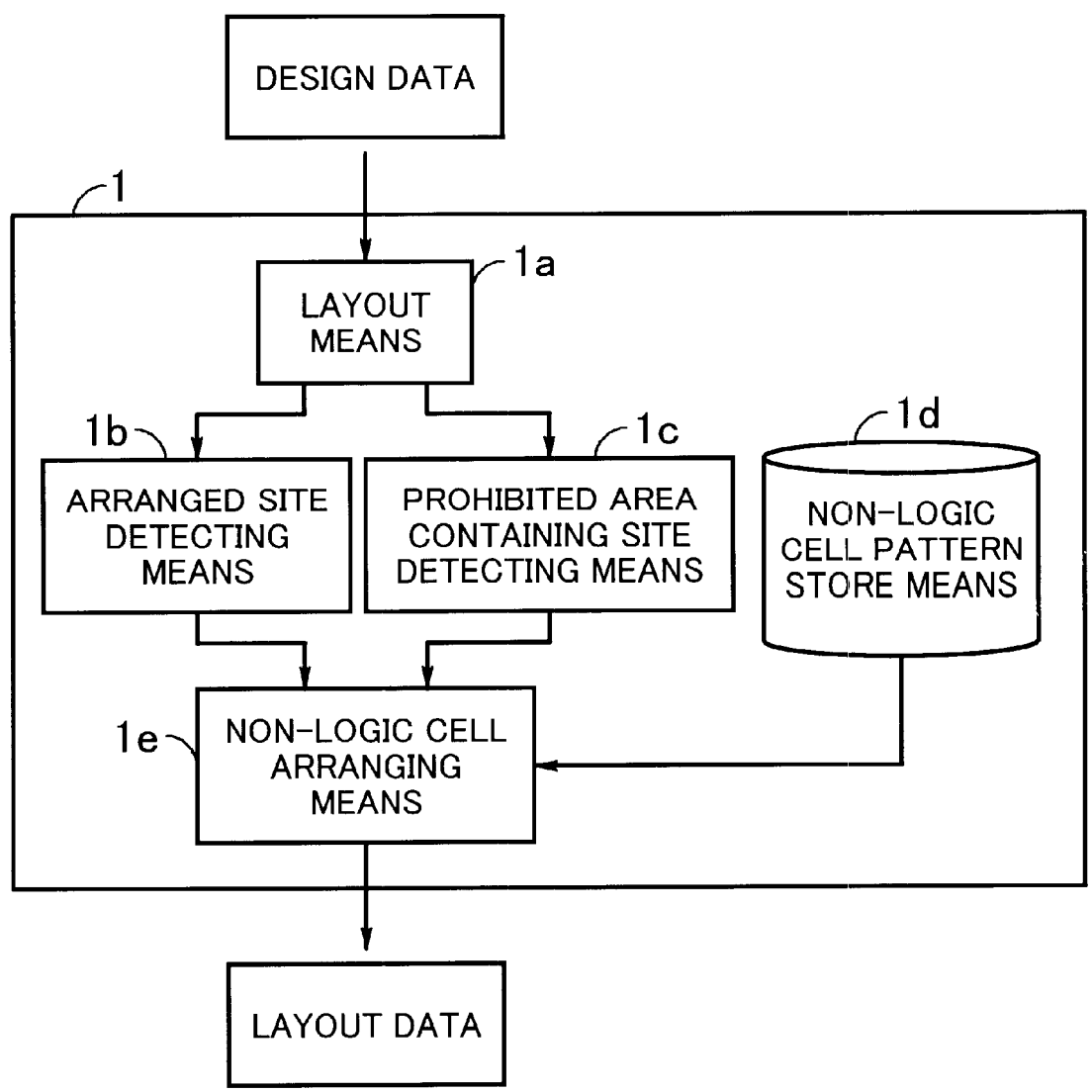
FIG. 1 is a view for describing the operating principle of the present invention.

FIG. 1 is a view for describing the operating principle of the present invention. As shown in FIG. 1, a design support apparatus for semiconductor devices 1 according to the present invention comprises layout means 1a, arranged site detecting means 1b, prohibited area containing site detecting means 1c, non-logic cell pattern store means 1d, and non-logic cell arranging means 1e.

The layout means 1a does a layout for logic cells and wiring patterns to connect logic cells.

The arranged site detecting means 1b detects an arranged site (area where cells are arranged), being a site which contains neither a logic cell nor a prohibited area, after a layout is done by the layout means 1a.

The prohibited area containing site detecting means 1c detects a prohibited area containing site, being a site which only contains a prohibited area.

The non-logic cell pattern store means 1d stores the patterns of non-logic cells to be arranged. In this case, a non-logic cell is one containing an element other than a logic element. For example, a metal pattern or a equivalent capacity element consisting of active elements is a non-logic cell. A metal pattern is added in order to prevent an abnormality in the shape of patterns (wiring patterns, for the most part), which consist of a metal layer, from occurring where the density of the patterns is low. An equivalent capacity element is added as a decoupling capacitor for preventing electromagnetic radiation.

The non-logic cell arranging means 1e arranges non-logic cells on a prohibited area containing site which meets predetermined conditions and on an arranged site.

Now, operation in FIG. 1 will be described.

It is assumed that a logic design for a semiconductor device has been made, that the operation of logic cells has been checked by a logic simulation, and that wiring delay has been checked by a delay simulation.

In this state of things, the layout means 1a performs a planning process for determining the arrangement of logic cell groups (functional blocks) which carry out the same function. By doing so, the general layout of the functional blocks will be determined. After performing the planning process, the layout means 1a does a layout for individual logic cells.

After the layout means 1a does a layout for logic cells, the arranged site detecting means 1b detects an arranged site which contains neither a logic cell nor a prohibited area.

The prohibited area containing site detecting means 1c detects a prohibited area containing site on which a logic cell is not arranged and which contains a prohibited area.

The non-logic cell arranging means 1e first selects a predetermined non-logic cell from among a plurality of types of non-logic cells stored in the non-logic cell pattern store means 1d and arranges it on an arranged site detected by the arranged site detecting means 1b. This selection will be made on the basis of, for example, whether the total capacity value of a non-logic cell satisfies a capacity value set in advance.

Then the non-logic cell arranging means 1e compares a prohibited area contained in a prohibited area containing site detected by the prohibited area containing site detecting means 1c with each non-logic cell pattern stored in the non-logic cell pattern store means 1d, selects a non-logic cell the pattern of which does not conflict with the prohibited area, and arranges it.

By performing the above processes, the arrangement of non-logic cells on design data for which a layout has been done will be completed.

As stated above, a design support apparatus for semiconductor devices according to the present invention makes a search for an area where a non-logic cell can be arranged and arranges a non-logic cell having an appropriate pattern, after doing a layout for a semiconductor device. This enables to perform a layout process without taking into consideration the existence of non-logic cells. As a result, a layout process can be performed quickly.

Furthermore, non-logic cells with a plurality of patterns are provided and the most suitable pattern for an area where non-logic cells are arranged is selected. Therefore, a larger number of non-logic cells can be arranged.

As a result, if a non-logic cell is a metal pattern, then distortion of patterns surrounding it and consisting of a metal layer can be prevented reliably. Alternatively, if a non-logic cell is an equivalent capacity element, then electromagnetic radiation can be prevented reliably by securing a capacity value required.

An embodiment of the present invention will now be described.

Figure 2:
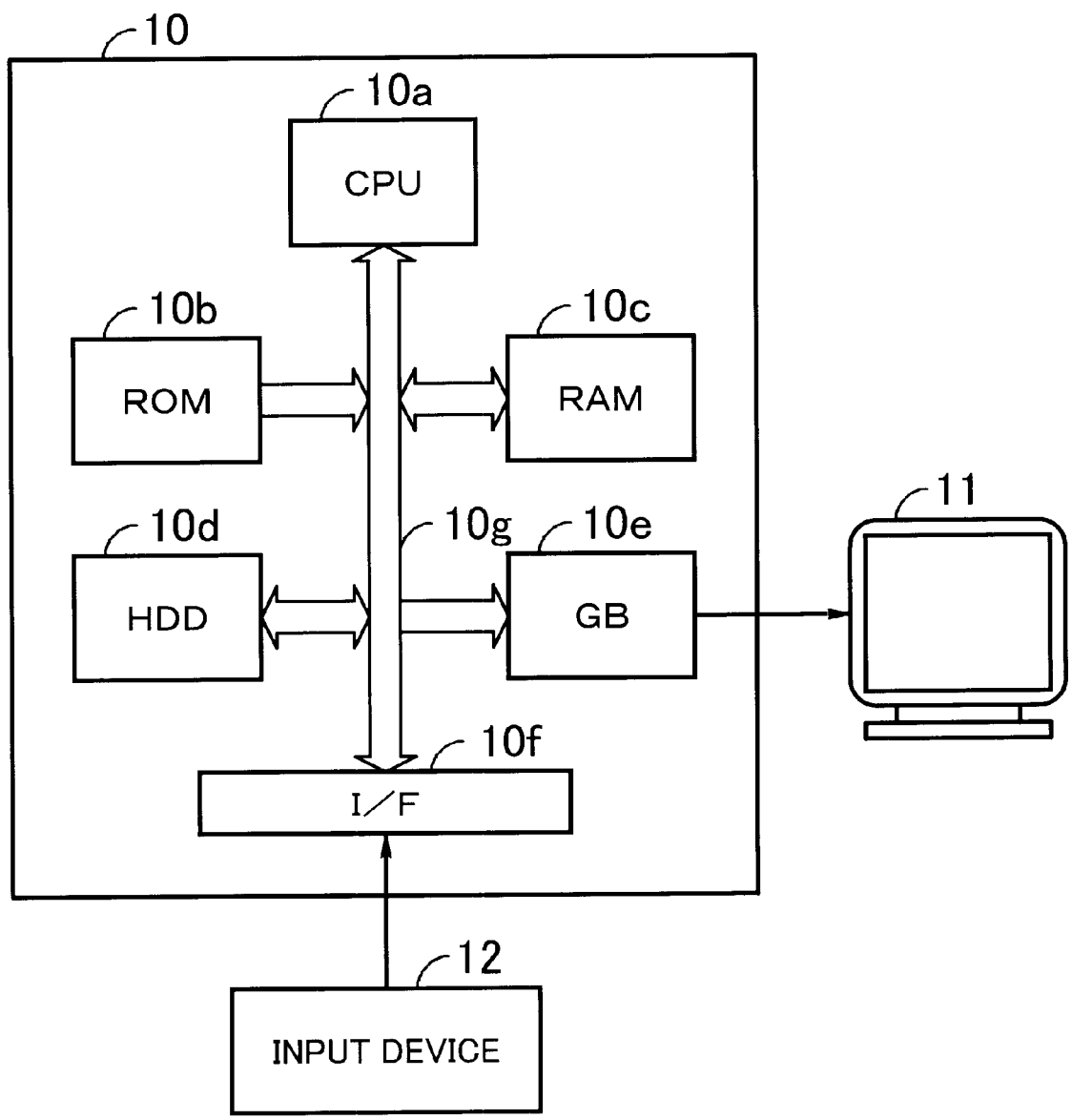
FIG. 2 is a view showing the configuration of an embodiment of the present invention.

FIG. 2 is a view showing the configuration of an embodiment of the present invention. As shown in FIG. 2, a design support apparatus for semiconductor devices 10 according to the present invention comprises a central processing unit (CPU) 10a, a read only memory (ROM) 10b, a random access memory (RAM) 10c, a hard disk drive (HDD) 10d, a graphics board (GB) 10e, an interface (I/F) 10f, and a bus log. Furthermore, a display device 11 and input device 12 are externally connected to the design support apparatus for semiconductor devices 10.

The CPU 10a controls the whole of the apparatus and performs various operations, in compliance with application programs stored in the HDD 10d.

The ROM 10b stores basic programs executed by the CPU 10a, data, and the like.

The RAM 10c temporarily stores programs to be executed and data when the CPU 10a performs various processes.

The HDD 10d stores application programs executed by the CPU 10a, data, and the like.

The GB 10e performs a drawing process in accordance with a drawing command supplied from the CPU 10a, converts an image obtained to the corresponding image signals, and outputs them.

The I/F 10f consists of, for example, a universal serial bus (USB) etc. and converts properly the format of data input from the input device 12.

The bus log connects the CPU 10a, ROM 10b, RAM 10c, HDD 10d, GB 10e, and I/F 10f with one another and enables an information exchange between them.

The display device 11 consists of a cathode ray tube (CRT) monitor etc., converts image signals output from the GB 10e to the corresponding images, and outputs them.

The input device 12 consists of, for example, a keyboard, a mouse, or the like, generates information in response to a user's operation, and outputs it.

Now, a non-logic cell to be arranged in the present invention will be described in detail with reference to FIGS. 3(A), 3(B), and 3(C).

Non-logic cells shown in these examples are of three types: Type 1, Type 2, and Type 3. With a Type 1 non-logic cell shown in FIG. 3(A), two transistors having the p-type MOS structure are juxtaposed. That is to say, in this example, $P^+$-type regions 20b through 20d are formed on an N type substrate 20a and gate electrodes 20e and 20f are formed on the border areas between the $P^+$-type regions.

In addition, terminals 20g and 20h are formed on the gate electrodes 20e and 20f (on this side of the figure). The terminal 20g is connected to the gate electrode 20f by a contact (horizontally hatched area). The terminal 20h is connected to the $P^+$-type regions 20c and 20d by contacts. The edge portions of the terminals 20g and 20h are connected to power supply VSS and VDD for a metal 1 layer by vias between the metal 1 layer and a metal 2 layer (vertically hatched areas) respectively.

The Type 1, Type 2, and Type 3 non-logic cells differ in how to arrange terminals. Therefore, their capacity values also differ. In this example, the capacity values of the Type 1, Type 2, and Type 3 non-logic cells are 10, 10, and 12 femtofarad (fF) respectively.

Figure 4:
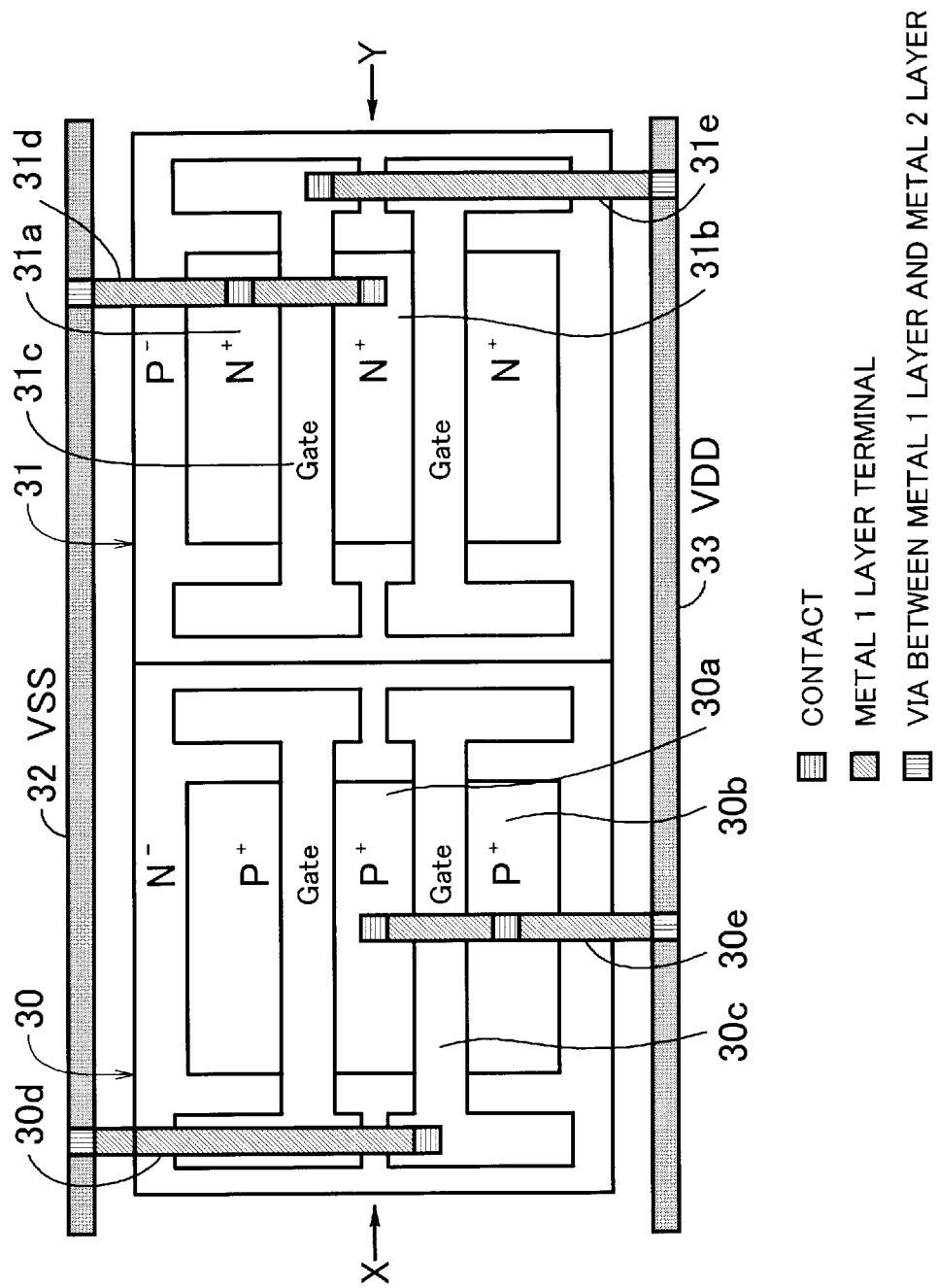
FIG. 4 is a view showing the configuration of a non-logic cell which consists of a p-type MOS transistor and n-type MOS transistor juxtaposed to each other and is connected to power supply.

FIG. 4 is a view showing the configuration of a non-logic cell which consists of a p-type MOS transistor and n-type MOS transistor juxtaposed to each other and is connected to power supply.

In this example, a p-type MOS transistor 30 and n-type MOS transistor 31 are juxtaposed to each other. A gate electrode 30c of the p-type MOS transistor 30 is connected to a power supply line 32 (VSS) via a terminal 30d. P$^+$-type regions 30a and 30b are connected to a power supply line 33 (VDD) via a terminal 30e.

N$^+$-type regions 31a and 31b of the n-type MOS transistor 31 are connected to the power supply line 32 (VSS) via a terminal 31d. A gate electrode 31c is connected to the power supply line 33 (VDD) via a terminal 31e.

Figure 5:
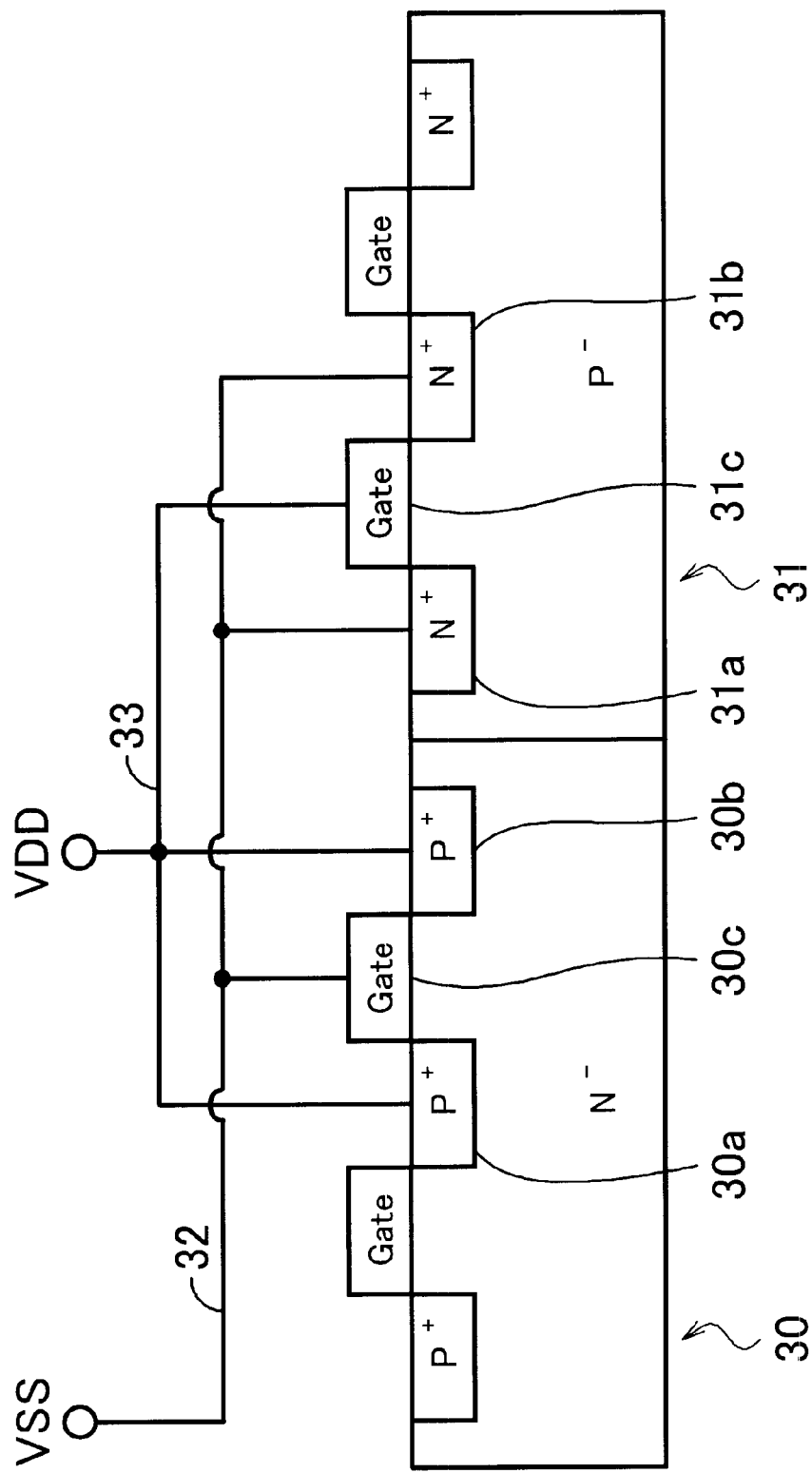
FIG. 5 is a sectional view of the p-type MOS transistor shown in FIG. 4 taken from the X direction and of the n-type MOS transistor shown in FIG. 4 taken from the Y direction.

FIG. 5 is a sectional view of the p-type MOS transistor 30 shown in FIG. 4 taken from the X direction and of the n-type MOS transistor 31 shown in FIG. 4 taken from the Y direction.

As shown in FIG. 5, the power supply line 32 (VSS) is connected to the gate electrode 30c of the p-type MOS transistor 30 and to the N$^+$-type regions 31a and 31b of the n-type MOS transistor 31. The power supply line 33 (VDD) is connected to the P$^+$-type regions 30a and 30b of the p-type MOS transistor 30 and to the gate electrode 31c of the n-type MOS transistor 31.

Figure 6A:
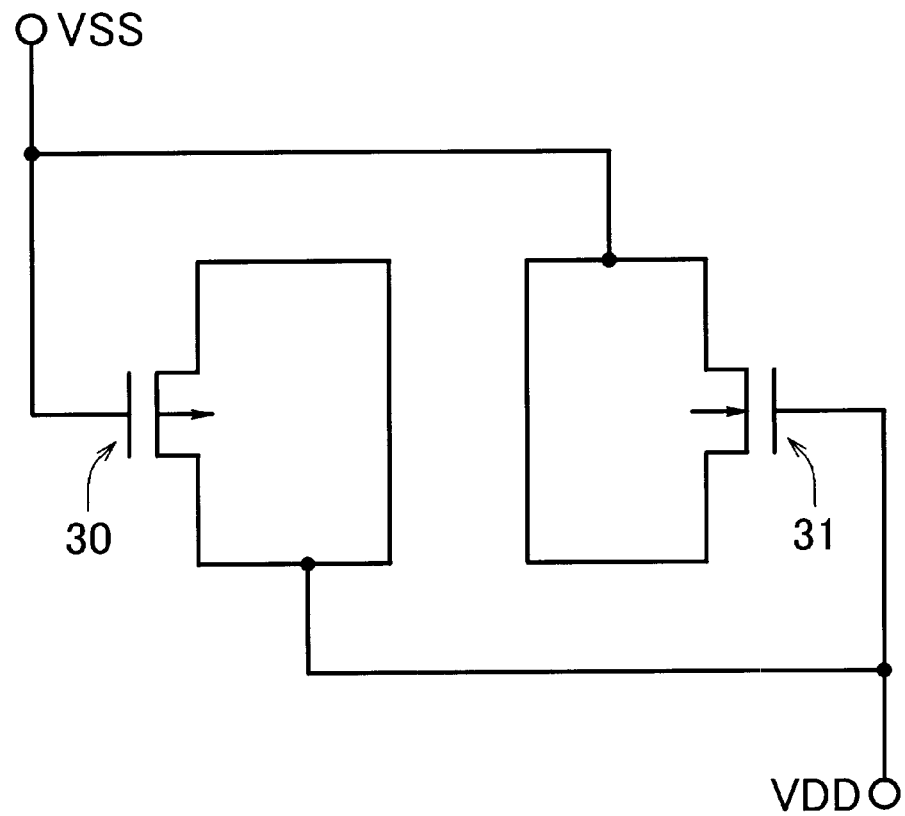
FIGS. 6(A) and 6(B) are views showing electrical equivalent circuits of the non-logic cell shown in FIG. 5.
Figure 6B:
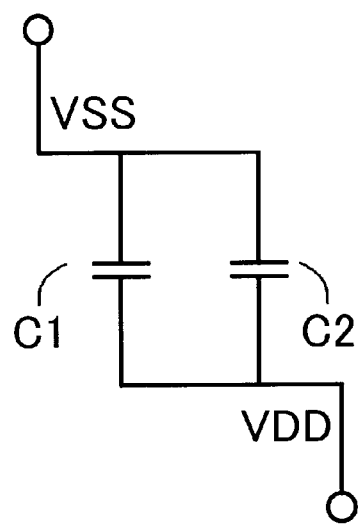

FIGS. 6(A) and 6(B) are views showing electrical equivalent circuits of the non-logic cell shown in FIG. 5. As shown in FIG. 6(A), the gate of the p-type MOS transistor 30 is connected to power supply VSS and its source and drain are both connected to power supply VDD. The source and drain of the n-type MOS transistor 31 are both connected to power supply VSS and its gate is connected to power supply VDD.

This means that C1, being a capacity component between the gate and the source and drain in the n-type MOS transistor, and C2, being a capacity component between the gate and the source and drain in the p-type MOS transistor, are connected in parallel. As a result, the equivalent circuit shown in FIG. 6(B) is given.

Now, operation in the embodiment of the present invention will be described with reference to FIG. 7. The process for manufacturing semiconductors will be described in brief, then operation in the embodiment of the present invention will be described.

As the first stage of designing a semiconductor device, (1) performance specifications are determined and (2) a logic design is made on the basis of these performance specifications. Then (3) a logic simulation and (4) a delay simulation are done on the logic design. After its operation is checked by these simulations, (5) the arrangement of elements on a semiconductor substrate is determined through an automatic layout. The automatic layout can be broadly divided into (5-1) floor planning for determining the arrangement of function blocks consisting of a plurality of logic cells, (5-2) placement for determining the arrangement of the logic cells in the function blocks, and (5-3) routing for wiring the logic cells, the arrangement of which has been determined, automatically to one another.

Now, processes for doing the automatic layout shown in (5) on the design data which has undergone processes (1) through (4) will be described.

Figure 7:
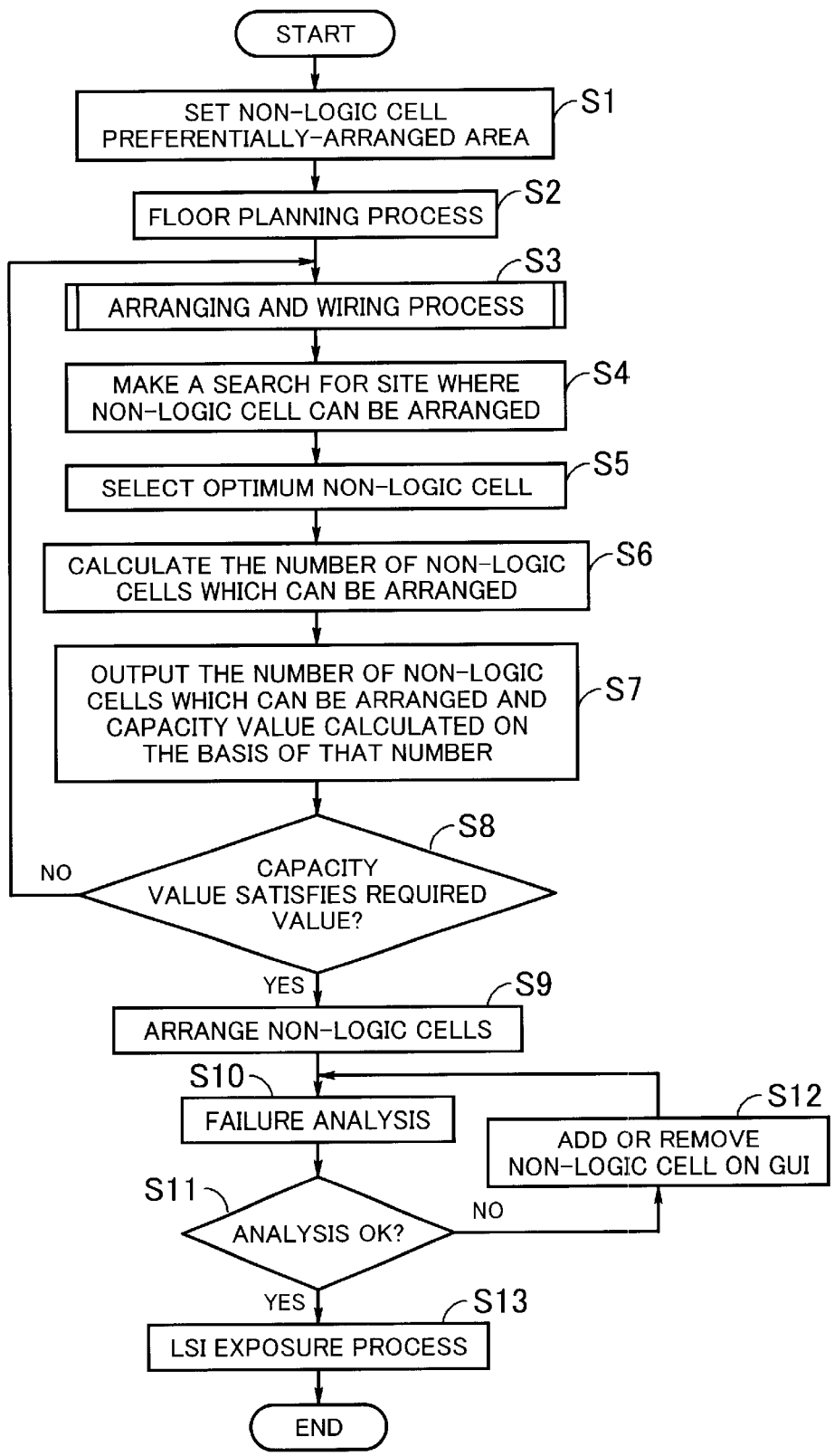
FIG. 7 is a flow chart for describing operation in a first embodiment of the present invention.

FIG. 7 is a flow chart for describing the flow of an automatic layout process performed in the embodiment of the present invention. Programs for performing this process are stored in the HDD 10d. They will be read out in response to an operator's request and be executed. The following procedure will be performed in compliance with this flow chart.

[S1] The CPU 10a sets a non-logic cell preferentially-arranged area.

A preferentially-arranged area is one where only non-logic cells are arranged. Such an area will be treated the same as other function blocks in the floor planning described later.

Figure 9:
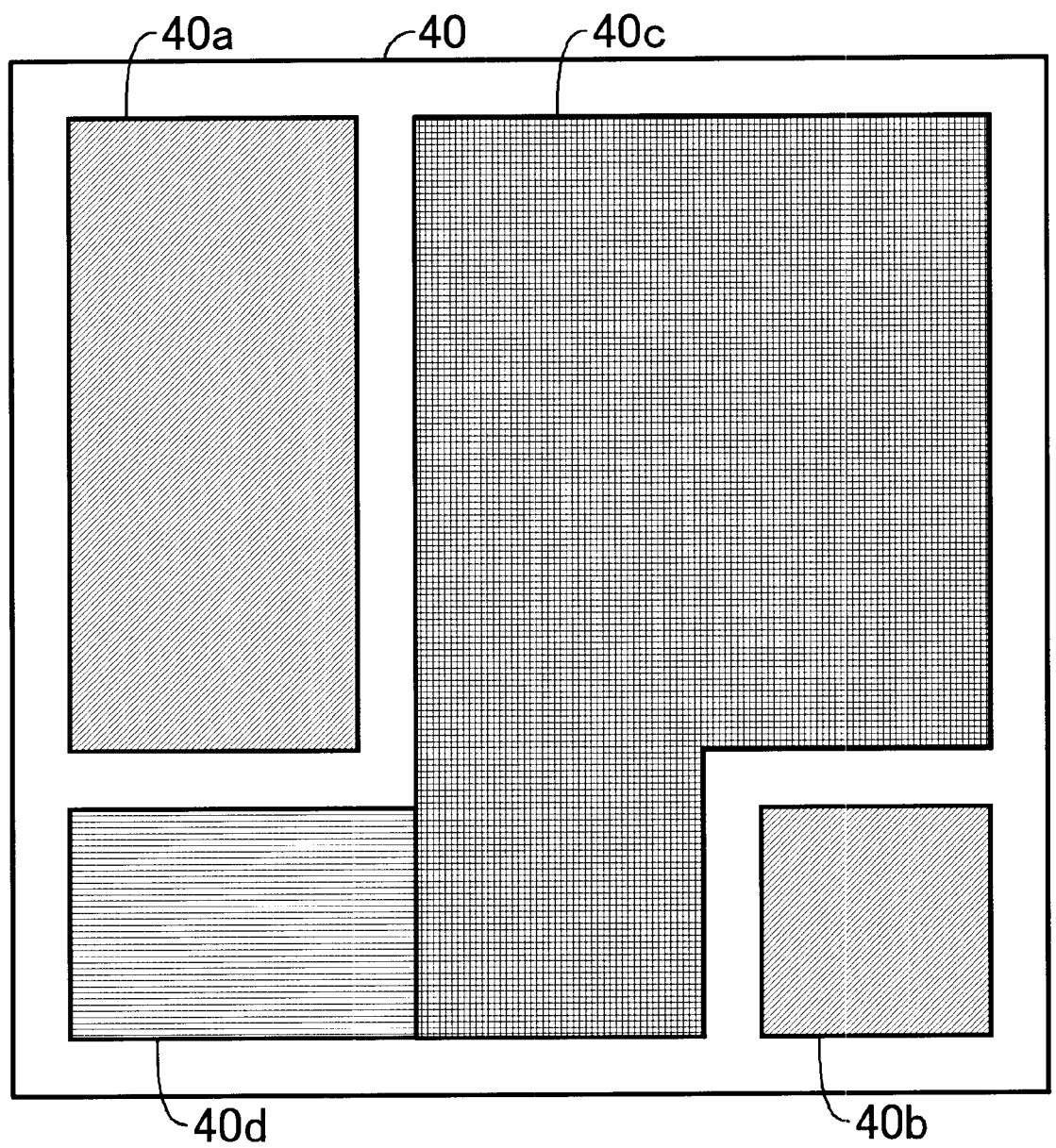
FIG. 9 is a view showing an image of a chip on which a non-logic cell preferentially-arranged area is secured.

FIG. 9 is a view showing an image of a chip on which a non-logic cell preferentially-arranged area is secured. In this example, macro cell arranged areas 40a and 40b, a unit cell arranged area 40c, and a non-logic cell preferentially-arranged area 40d are secured on a chip 40. A macro cell is one, such as a RAM or ROM, where the same pattern appears repeatedly. A unit cell is one which contains no repetitive pattern.

[S2] The CPU 10a performs a floor planning process on function blocks.

In this case, the preferentially-arranged area is also treated as one of the function blocks and the floor planning process is performed on it.

[S3] By performing an arranging and wiring process, the CPU 10a arranges logic cells in each of the function blocks arranged through the floor planning. This process will be described in detail later with reference to FIG. 8.

In this case, a non-logic cell of Type 1, Type 2, or Type 3 shown in FIG. 3 is selected and arranged in the non-logic cell preferentially-arranged area 40d.

[S4] The CPU 10a makes a search for a site where a non-logic cell can be arranged from among areas other than the non-logic cell preferentially-arranged area 40d.

Figure 10:
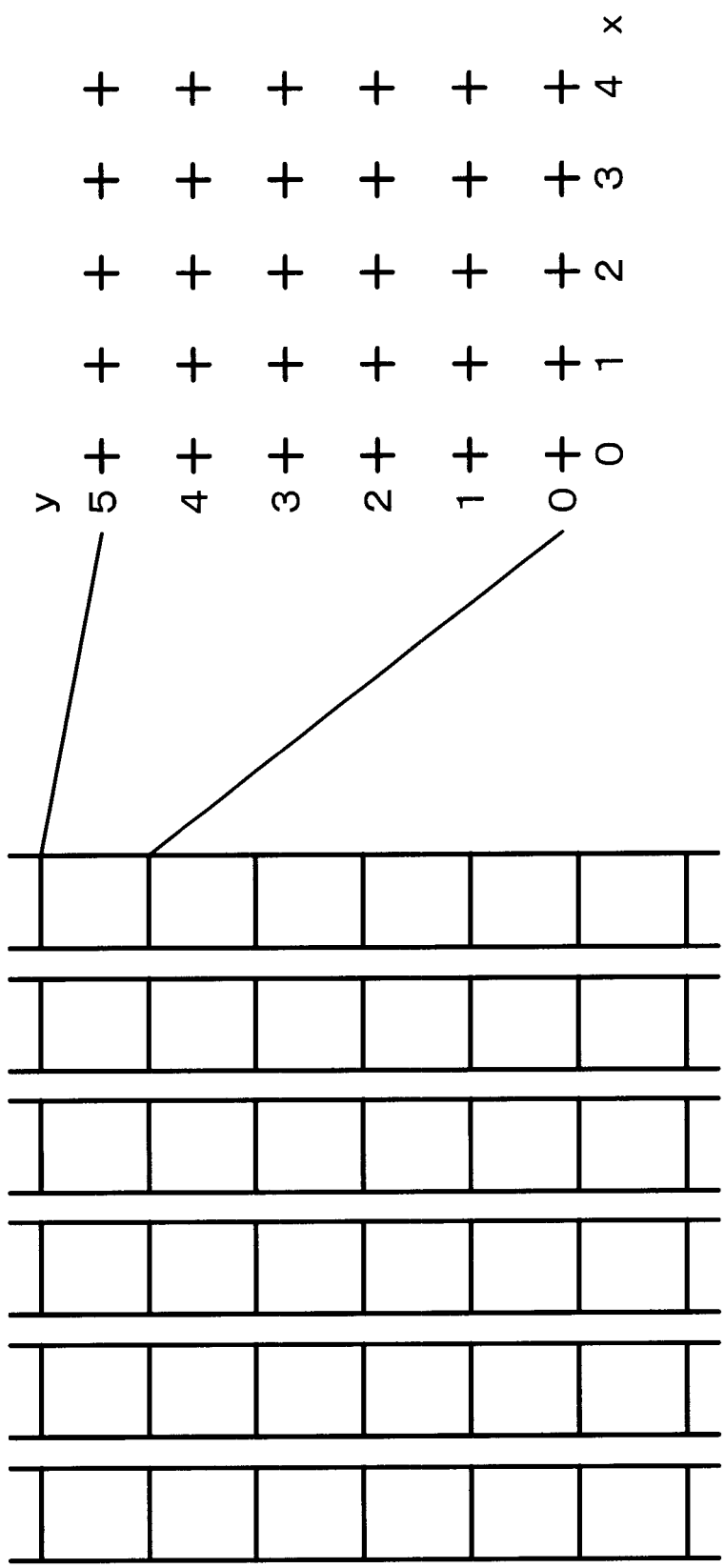
FIG. 10 is a view showing cell sites in detail.
Figures 11A, 11B, 11C:
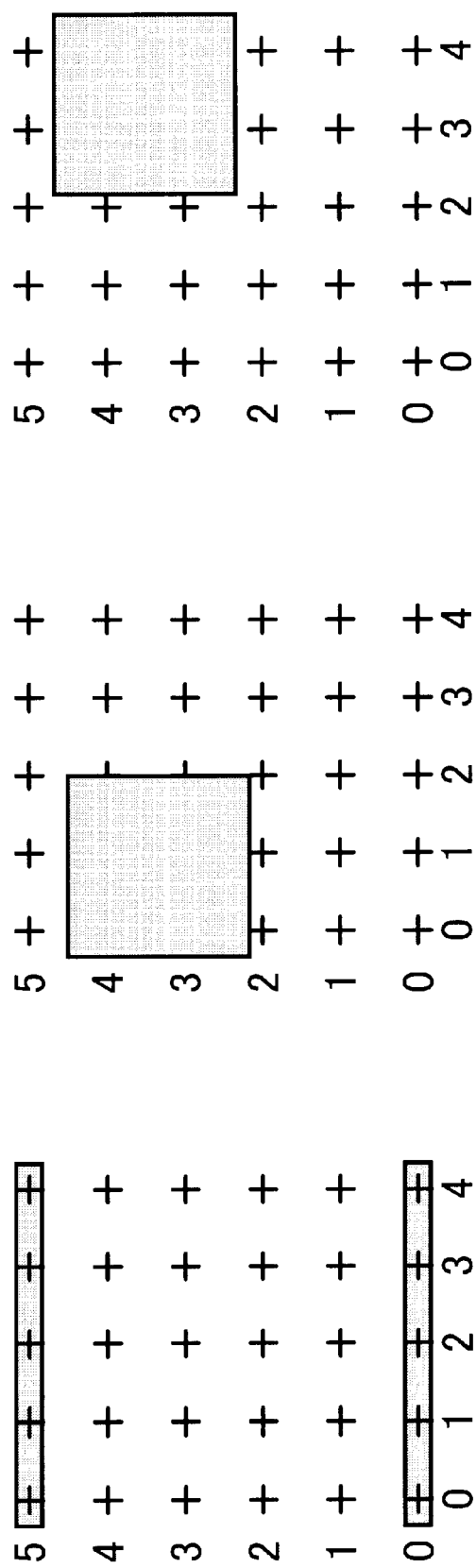
FIG. 11(A) shows cell sites which have power supply terminals and FIGS. 11(B) and 11(C) are views showing cell sites to be excluded.

A method for doing so is as follows. First, a search for sites with a power supply line and without a logic cell is made. That is to say, as shown in FIG. 10, it is assumed that a site where a cell is arranged consists of a wiring grid numbered zero to four in the x direction and zero to five in the y direction. Then, as shown in FIG. 11(A), sites on which power supply lines for a metal 2 layer having a length of x=0–4 at y=5 and y=0 respectively are arranged and which do not contain a logic cell are selected.

Then sites where a prohibited area is not set in advance are detected from among the sites obtained because any non-logic cell can be arranged on these sites.

Subsequently, prohibition information for avoiding a conflict with a non-logic element pattern is detected from among the sites obtained. Then a non-logic cell of which the non-logic element pattern does not conflict with a prohibited area is selected in step S5.

[S5] From among non-logic cells of Type 1, Type 2, and Type 3, the CPU 10a selects a non-logic cell which can be arranged without conflicting with a prohibited area for each of the sites containing only prohibition information which were detected in step S4.

Furthermore, the CPU 10 a selects one of Type 1, Type Lip 2, and Type 3 preferentially designated for the sites not containing prohibition information which were detected in step S4.

To be concrete, from among the sites with a power supply line and prohibited area and without a logic cell which were selected in step S4, sites containing at least part of a metal 1 layer prohibited area or metal 2 layer prohibited area, as shown in FIG. 11(B) or 11(C), are excluded.

Then the CPU 10a judges for each of the sites selected which of non-logic cells of Type 1, Type 2, and Type 3 shown in FIGS. 3(A), 3(B), and 3(C) respectively can be arranged without conflict.

Figure 12:
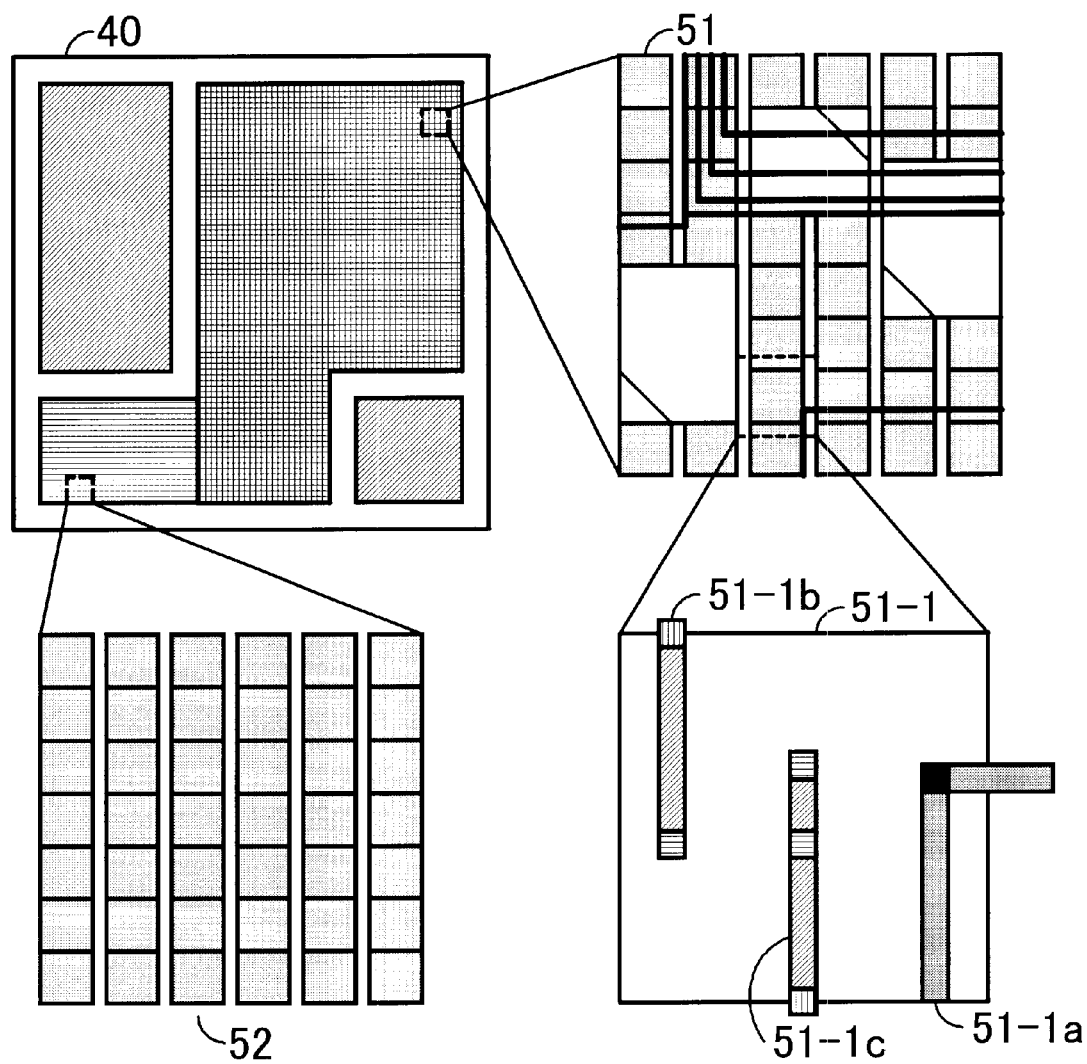
FIG. 12 is an enlarged fragmentary view of cell sites.

In an example shown in FIG. 12, for example, a line 51-1a is arranged in a cell 51-1 in an enlarged unit cell arranged area. A non-logic cell of Type 2 shown in FIG. 3(B) does not conflict with the line 51-1a. In step S5, therefore, a non-logic cell of Type 2 will be selected for the cell 51-1.

[S6] On the basis of processing results in steps S3 and S5, the CPU 10a calculates the types and number of non-logic cells which can be arranged both in the preferentially-arranged area and in the other areas.

[S7] The CPU 10a outputs, as a report, the number of non-logic cells which can be arranged and a capacity value Via (predetermined physical constant) calculated on the basis of that number.

FIG. 13 is a view showing the number and total capacity values of non-logic cells according to types which can be arranged. This example indicates that 23,000 non-logic cells of Type 1 can be arranged and that the total capacity value is 230 picofarad (pF). This example also indicates that 40,000 non-logic cells of Type 2 can be arranged and that the total capacity value is 400 pF. Moreover, this example indicates that 12,000 non-logic cells of Type 3 can be arranged and that the total capacity value is 144 pF. In addition, this example indicates that the total number and capacity of these non-logic cells are 75,000 and 774 pF respectively.

[S8] The CPU 10a judges whether or not the capacity value calculated satisfies a required value. If the capacity value calculated does not satisfy the required value, the CPU 10a returns to step S3. If the capacity value calculated satisfies the required value, the CPU 10a proceeds to step S9.

[S9] The CPU 10a arranges non-logic cells according to the results of the above layout process.

[S10] The CPU 10a performs failure analysis in order to analyze whether or not a short circuit etc. have occurred between the non-logic cells and other patterns.

[S11] The CPU 10a judges whether or not the analysis has been completed normally. If the analysis has been completed normally, the CPU 10a proceeds to step S13. If the analysis has not been completed normally, the CPU 10a proceeds to step S12.

Figure 14:
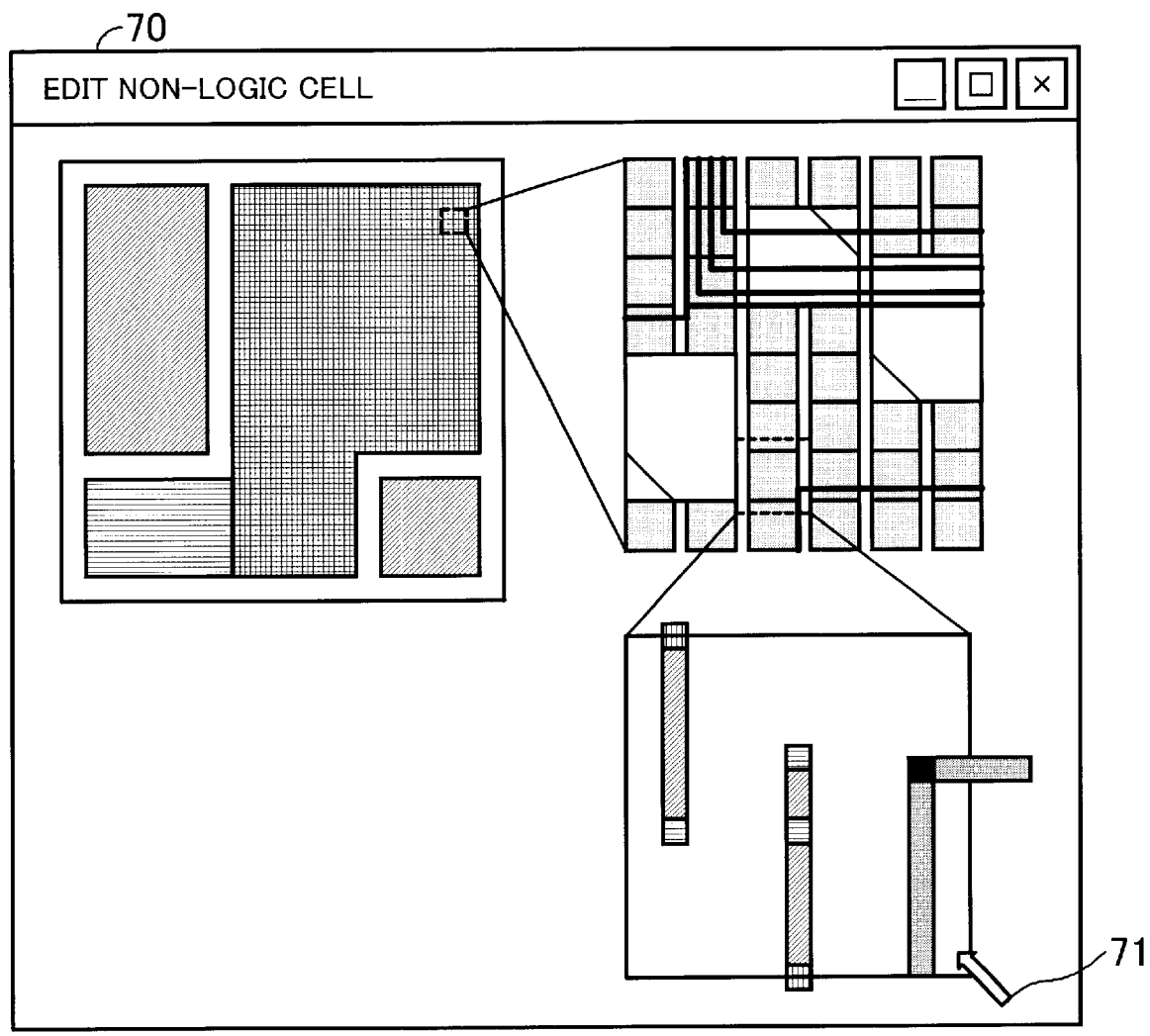
FIG. 14 is an example of a non-logic cell edit screen.

[S12] The CPU 10a displays a graphical user interface (GUI), like the one shown in FIG. 14, on the display device 11 and has a user instruct how to treat a non-logic cell which has caused a failure. On the screen 70, the user can designate the non-logic cell which has caused a failure with, for example, a pointer 71 and can remove it by predetermined operation. Furthermore, a non-logic cell can be added at need.

[S13] The CPU 10a performs an LSI exposure process.

Figure 8:
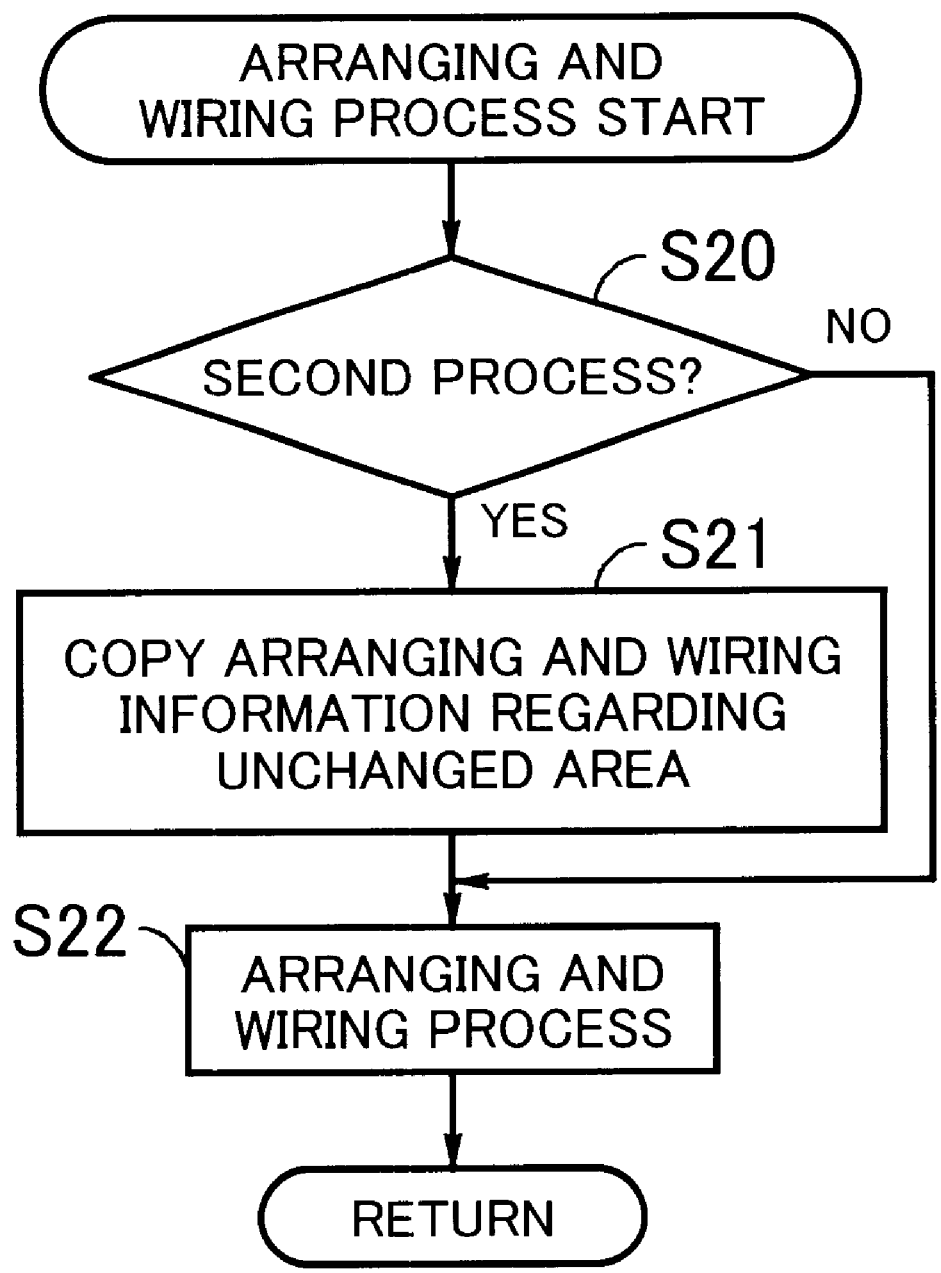
FIG. 8 is a flow chart for describing in detail the placement process shown in FIG. 7.

Now, the arranging and wiring process of step S3 shown in FIG. 7 will be described in detail with reference to FIG. 8. The following procedure will be performed in compliance with this flow chart.

[S20] The CPU 10a judges whether or not this is a second arranging and wiring process. If this is a second arranging and wiring process, the CPU 10 a proceeds to step S21. If this is not a second arranging and wiring process, the CPU 10a proceeds to step S22.

For example, if a "NO" judgment was made in step S8 shown in FIG. 7, a second arranging and wiring process will be performed. The CPU 10a therefore proceeds to step S21.

[S21] The CPU 10a copies arranging and wiring information regarding an unchanged area. That is to say, if part of logic information is changed, the CPU 10a obtains arranging and wiring information regarding an unchanged area from the information before the change being made and copies it to the information after the change being made.

[S22] The CPU 10a performs an arranging and wiring process on an area other than the copied one and then returns to the original process.

In the above procedure, a non-logic cell preferentially-arranged area is secured before floor planning and non-logic cells are preferentially arranged in this area. This enables to secure necessary capacity at a time.

Furthermore, a non-logic cell preferentially arranged area is independent of other function blocks. Therefore, even if the number of non-logic cells is increased or decreased at need after an arranging and wiring process, these function blocks will not be influenced. This makes design easy.

Moreover, non-logic cells are arranged after wiring is fully completed. As a result, an automatic layout can be done without taking into consideration the existence of non-logic cells. This enables to perform a layout process quickly. In addition, after a layout process, an extra non-logic cell can be removed or a non-logic cell can be added. This enables to adjust the number of non-logic cells finely.

A second embodiment of the present invention will now be described.

In the process for manufacturing a semiconductor device, an area dotted with metal patterns (area where metal pattern density is low) may cause distortion in the corresponding area of a semiconductor device formed. In the second embodiment, in order to avoid such a situation, this distortion is prevented by arranging a metal pattern shape abnormality preventing cell (hereinafter referred to as an "abnormality preventing cell") in an area where metal pattern density is low.

Figure 15C:
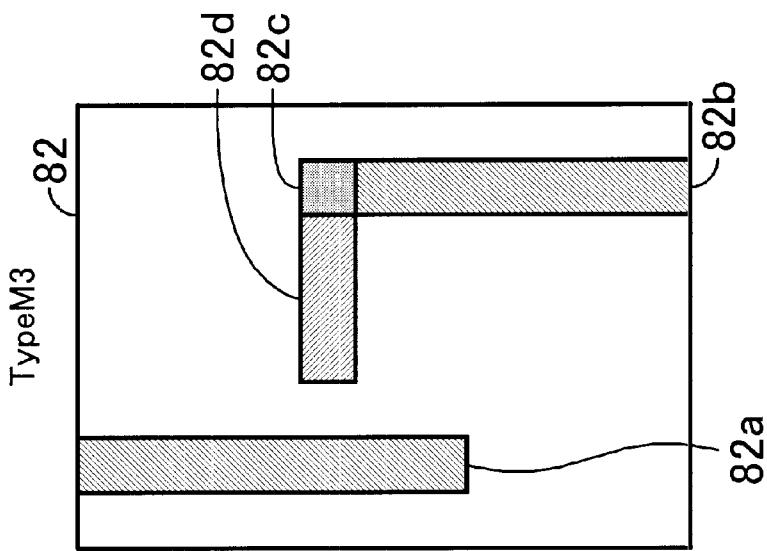
FIGS. 15(A), 15(B), and 15(C) are views showing examples of abnormality preventing cells, FIG. 15(A) being a view showing a Type M1 cell, FIG. 15(B) being a view showing a Type Md2 cell, and FIG. 15(C) being a view showing a Type M3 cell.
Figure 15B:
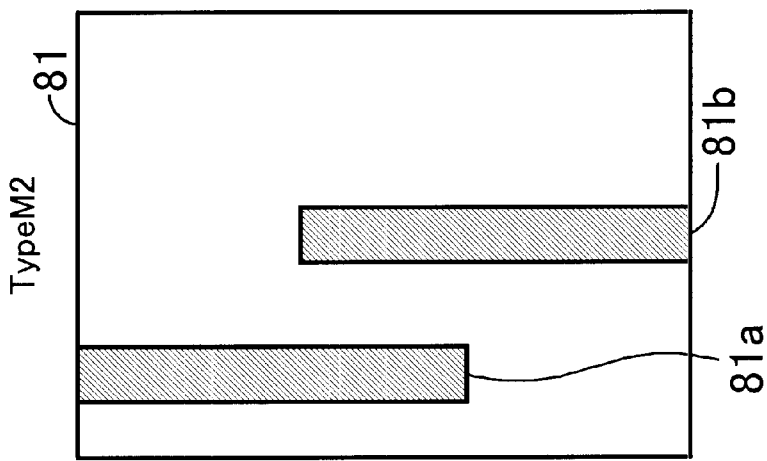
Figure 15A:
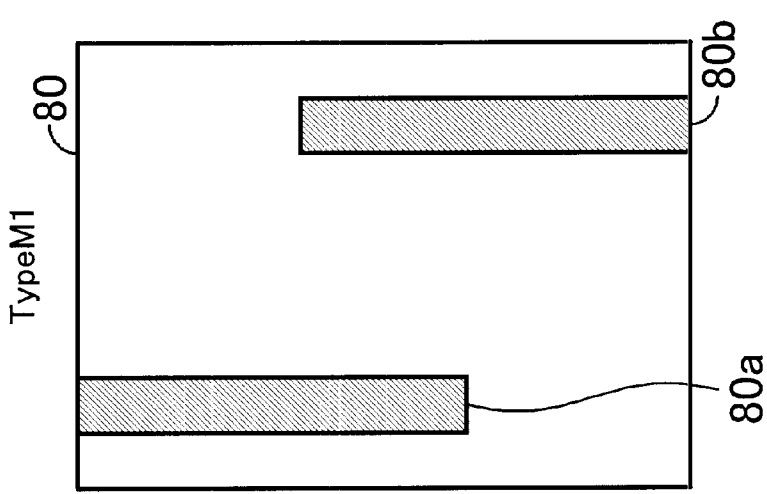

FIGS. 15(A), 15(B), and 15(C) are views showing examples of abnormality preventing cells used in the second embodiment of the present invention.

An abnormality preventing cell 80 shown in FIG. 15(A) is a cell of Type M1 and consists of metal 1 layer patterns 80a and 80b arranged at the left and right edges of it respectively.

An abnormality preventing cell 81 shown in FIG. 15(B) is a cell of Type M2 and consists of metal 1 layer patterns 81a and 81b arranged at the left edge of and in the middle of it respectively.

An abnormality preventing cell 82 shown in FIG. 15(C) is a cell of Type M3 and consists of a metal 1 layer pattern 82a arranged at the left edge of it, a metal 1 layer pattern 82b arranged at the right edge of it, a horizontal metal 2 layer pattern 82d, and a via between a metal 1 layer and a metal 2 layer 82c which connects the metal 1 layer pattern 82b and the metal 2 layer pattern 82d. These abnormality preventing cell patterns are mere examples.

Figure 16:
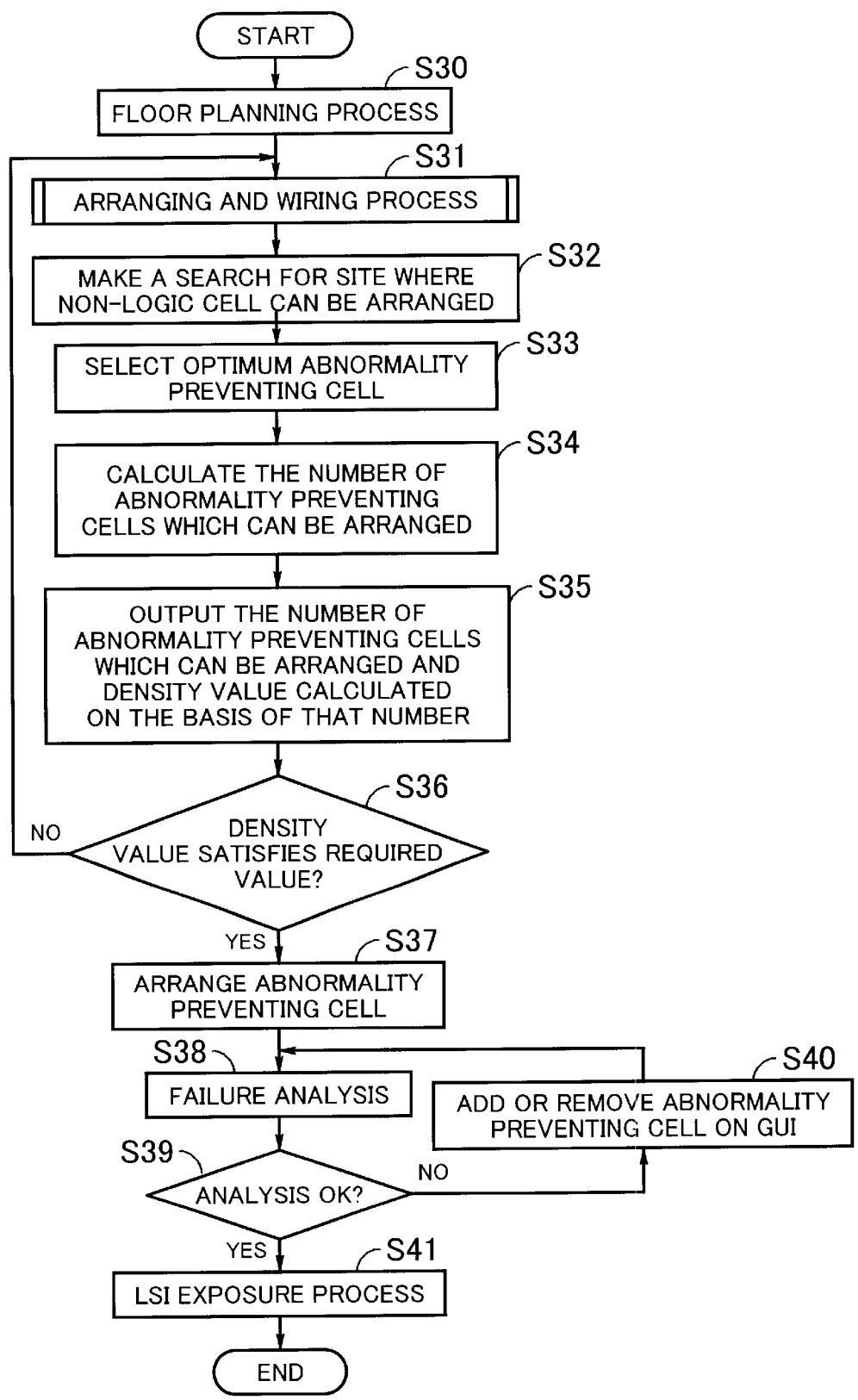
FIG. 16 is a flow chart for describing operation in a second embodiment of the present invention.

Now, operation in the second embodiment of the present invention will be described with reference to FIG. 16. Processes in this flow chart are performed when a delay simulation is completed, which is the same with the first embodiment of the present invention. The following procedure will be performed in compliance with this flow chart.

[S30] The CPU 10a performs a floor planning process on function blocks. In this example, a non-logic cell preferentially-arranged area does not exist, so planning on that area is not performed.

[S31] By performing an arranging and wiring process, the CPU 10a arranges logic cells in each of the function blocks arranged through the floor planning. The details of this process are the same with FIG. 8.

[S32] The CPU 10a makes a search for a site where a non-logic cell can be arranged.

In this embodiment, power supply for a transistor is unnecessary, so whether or not a power supply line exists is not judged. As for the rest, it is the same with the first embodiment.

[S33] From among cells of Type M1, Type M2, and Type M3, the CPU 10a selects a non-logic cell which can be arranged without conflicting with a prohibited area for each of the sites containing only prohibition information which were detected in step S32.

[S34] On the basis of processing results in step S33, the CPU 10a calculates the types and number of abnormality preventing cells which can be arranged.

[S35] The CPU 10a outputs, as a report, the number of abnormality preventing cells which can be arranged and a density value calculated on the basis of that number.

For example, a semiconductor device pattern is divided into a plurality of areas and density in each area is calculated and reported.

[S36] The CPU 10a judges whether or not the density value calculated satisfies a required value. If the density value calculated does not satisfy the required value, the CPU 10a returns to step S31. If the density value calculated satisfies the required value, the CPU 10a proceeds to step S37.

[S37] The CPU 10a arranges abnormality preventing cells according to the results of the above layout process.

[S38] The CPU 10a performs failure analysis in order to analyze whether or not a short circuit etc. have occurred between the abnormality preventing cells and other patterns.

[S39] The CPU 10a judges whether or not the analysis has been completed normally. If the analysis has been completed normally, the CPU 10a proceeds to step S41. If the analysis has not been completed normally, the CPU 10a proceeds to step S40.

[S40] The CPU 10a displays a GUI, like the one shown in FIG. 14, on the display device 11 and has a user instruct how to treat an abnormality preventing cell which has caused a failure. On the screen 70, the user can designate the abnormality preventing cell which has caused a failure with, for example, the pointer 71 and can remove it by predetermined operation. Furthermore, an abnormality preventing cell can be added at need.

[S41] The CPU 10a performs an LSI exposure process.

In the above procedure, abnormality preventing cells are arranged after wiring is fully completed. As a result, an automatic layout can be done without taking into consideration the existence of abnormality preventing cells. This enables to perform a layout process quickly. In addition, after a layout process, an extra abnormality preventing cell can be removed or a abnormality preventing cell can be added. This enables to adjust the number of abnormality preventing cells finely.

Furthermore, a non-logic element does not influence circuit logic. Therefore, a non-logic cell can be added or removed easily without changing logic.

The descriptions of the above embodiments have been given with an equivalent capacity element and abnormality preventing cell as examples of a non-logic cell, but the present invention should not be limited to these cases.

Finally the above processing functions can be realized with a computer. In that case, the contents of functions which a design support apparatus for semiconductor devices must have are described in a program recorded on a record medium which can be read with a computer. The above procedure is achieved with a computer by executing this program on the computer. A record medium which can be read with a computer can be a magnetic recording medium, a semiconductor memory, or the like. In order to place this program on the market, it can be stored on a portable record medium, such as a compact disk read only memory (CD-ROM) or a floppy disk. Alternatively, it can be stored in a memory of a computer connected via a network and be transferred to another computer via a network. When this program is executed on a computer, it is stored on a hard disk etc. in the computer and is loaded into a main memory.

As stated above, a design support apparatus for semiconductor devices for helping to design semiconductor devices according to the present invention comprises layout means for doing a layout for logic cells and wiring patterns to connect the logic cells, arranged site detecting means for detecting, after a layout being done by the layout means, an arranged site being a site containing neither the logic cells nor a prohibited area, and non-logic cell arranging means for arranging non-logic cells on the arranged site. As a result, after arrangement and wiring related to logic is fully completed, non-logic cells are arranged. This enables to do arrangement and wiring without taking into consideration the existence of non-logic cells and to add or remove a non-logic cell without influencing a portion related to logic.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A design support apparatus for semiconductor devices for helping to design semiconductor devices, the apparatus comprising:

layout means for doing a layout for logic cells and wiring patterns to connect the logic cells;

arranged site detecting means for detecting, after a layout being done by the layout means, an arranged site being a site containing neither the logic cells nor a prohibited area; and non-logic cell arranging means for arranging non-logic bells on the arranged site.

2. The design support apparatus for semiconductor devices according to claim 1, wherein the non-logic cells are equivalent capacity elements comprising active elements.

3. The design support apparatus for semiconductor devices according to claim 1, further comprising:

non-logic cell pattern store means for storing a non-logic cell pattern; and prohibited area containing site detecting means for detecting a prohibited area containing site, being a site which only contains a prohibited area, wherein the non-logic cell arranging means compares the arrangement of the prohibited area on the prohibited area containing site with the non-logic cell pattern: and arranges the non-logic cells only on a site where the arrangement and the pattern do not conflict with each other.

4. The design support apparatus for semiconductor devices according to claim 3, wherein the non-logic cell pattern store means stores a plurality of cell patterns of different types, further wherein the non-logic cell arranging means selects non-logic cells the pattern of which does not conflict with the prohibited area and arranges the non-logic cells.

5. The design support apparatus for semiconductor devices according to claim 1, further comprising:
   physical parameter calculating means for calculating a predetermined physical parameter for non-logic cells arranged by the non-logic cell arranging means; and
   display means for displaying a physical parameter calculated by the physical parameter calculating means.

6. The design support apparatus for semiconductor devices according to claim 5, further comprising redoing means for having the non-logic cell arranging means redo arrangement in the case of the physical parameter not satisfying a predetermined value.

7. The design support apparatus for semiconductor devices according to claim 6, wherein when arrangement is redone by the redoing means, the non-logic cell arranging means copies arrangement status in an area where a change is not made and uses the copied arrangement.

8. The design support apparatus for semiconductor devices according to claim 1, further comprising non-logic cell editing means for performing a editing process for adding or removing the non-logic cell after arrangement being completed by the non-logic cell arranging means.

9. A computer-readable record medium recording a computer program for performing a process for helping to design semiconductor devices, the program comprising the functions of:
   layout means for doing a layout for logic cells and wiring patterns to connect the logic cells;
   arranged site detecting means for detecting, after a layout being done by the layout means, an arranged site being a site containing neither the logic cells nor a prohibited area; and
   non-logic cell arranging means for arranging non-logic cells on the arranged site.

10. A design support method for semiconductor devices for helping to design semiconductor devices, comprising the steps of:
    layout step for doing a layout for logic cells and wiring patterns to connect the logic cells;
    arranged site detecting step for detecting, after a layout being done by the layout step, an arranged site being a site containing neither the logic cells nor a prohibited area; and
    non-logic cell arranging step for arranging non-logic cells on the arranged site.

11. A design support system for semiconductor devices for helping to design semiconductor devices, the system comprising:
    layout means for doing a layout for logic cells and wiring patterns to connect the logic cells;
    arranged site detecting means for detecting, after a layout being done by the layout means, an arranged site being a site containing neither the logic cells nor a prohibited area; and
    non-logic cell arranging means for arranging non-logic cells on the arranged site.

12. A design support apparatus for semiconductor devices for helping to design semiconductor devices, the apparatus comprising:
    preferentially-arranged area securing means for securing a preferentially-arranged area where a non-logic cell is preferentially arranged;
    floor planning means for performing floor planning on the preferentially-arranged area and other function blocks; and
    non-logic cell arranging means for arranging a non-logic cell in the preferentially-arranged area.

13. A computer-readable record medium recording a computer program for performing a process for helping to design semiconductor devices, the program comprising the functions of:
    preferentially-arranged area securing means for securing a preferentially-arranged area where a non-logic cell is preferentially arranged;
    floor planning means for performing floor planning on the preferentially-arranged area and other function blocks; and
    non-logic cell arranging means for arranging a non-logic cell in the preferentially-arranged area.

* * * * *